United States Patent
Yang et al.

(10) Patent No.: US 9,135,105 B2
(45) Date of Patent: *Sep. 15, 2015

(54) PROBABILITY-BASED REMEDIAL ACTION FOR READ DISTURB EFFECTS

(71) Applicant: SANDISK TECHNOLOGIES INC., Plano, TX (US)

(72) Inventors: Nian Niles Yang, Mountain View, CA (US); Chris Avila, Saratoga, CA (US); Steven Sprouse, San Jose, CA (US); Abhijeet Manohar, San Jose, CA (US); Yichao Huang, San Jose, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/286,632

(22) Filed: May 23, 2014

(65) Prior Publication Data

US 2014/0281685 A1 Sep. 18, 2014

Related U.S. Application Data

(63) Continuation of application No. 13/802,140, filed on Mar. 13, 2013.

(51) Int. Cl.
*G06F 11/07* (2006.01)
*G11C 29/50* (2006.01)
*G11C 16/34* (2006.01)
*G11C 29/42* (2006.01)
(Continued)

(52) U.S. Cl.
CPC ........ *G06F 11/0793* (2013.01); *G11C 16/3404* (2013.01); *G11C 29/42* (2013.01); *G11C 29/50004* (2013.01); *G11C 11/56* (2013.01); *G11C 2029/0409* (2013.01); *G11C 2029/0411* (2013.01)

(58) Field of Classification Search
CPC ............... G11C 16/3445; G11C 16/04; G11C 16/3418; G11C 16/3427; G11C 29/24
USPC ............. 714/721; 365/201, 196, 189.11, 194, 365/200; 711/106
See application file for complete search history.

(56) References Cited

U.S. PATENT DOCUMENTS

| 2004/0257888 A1 | 12/2004 | Noguchi et al. |
| 2006/0233020 A1 | 10/2006 | Ruby et al. |
| 2008/0288814 A1 | 11/2008 | Kitahara |

(Continued)

FOREIGN PATENT DOCUMENTS

EP    2077559 A2    7/2009

OTHER PUBLICATIONS

Non-Final Office Action mailed Sep. 24, 2014 in U.S. Appl. No. 13/802,104, 15 pages.

(Continued)

*Primary Examiner* — Guy Lamarre
(74) *Attorney, Agent, or Firm* — Toler Law Group, PC

(57) ABSTRACT

A method may be performed in a data storage device that includes a memory including a three-dimensional (3D) memory and a controller, in response to a request to read data from the memory. The data is located within a first word line of the memory. The method includes accessing the data from the first word line and determining, based on a probability threshold, whether to perform a remedial action with respect to a second word line.

28 Claims, 4 Drawing Sheets

(51) Int. Cl.
  *G11C 29/04* (2006.01)
  *G11C 11/56* (2006.01)

(56) References Cited

U.S. PATENT DOCUMENTS

| | | |
|---|---|---|
| 2009/0323412 A1 | 12/2009 | Mokhlesi et al. |
| 2010/0122148 A1* | 5/2010 | Flynn et al. .................. 714/773 |
| 2011/0078390 A1* | 3/2011 | Yamauchi .................... 711/154 |
| 2011/0119431 A1 | 5/2011 | Chowdhury |
| 2013/0297989 A1* | 11/2013 | Meir et al. .................... 714/773 |
| 2013/0301335 A1 | 11/2013 | Ong |
| 2013/0304982 A1* | 11/2013 | Jung et al. ..................... 711/106 |
| 2014/0136884 A1* | 5/2014 | Werner et al. ................ 714/6.11 |
| 2014/0143473 A1* | 5/2014 | Kim et al. ..................... 711/103 |
| 2014/0281685 A1 | 9/2014 | Yang et al. |
| 2014/0281766 A1* | 9/2014 | Yang et al. .................... 714/721 |

OTHER PUBLICATIONS

Final Office Action mailed Mar. 16, 2015 in U.S. Appl. No. 13/802,140, 13 pages.

* cited by examiner

PROBABILITY-BASED REMEDIAL ACTION FOR READ DISTURB EFFECTS

REFERENCE TO EARLIER-FILED APPLICATIONS

This application is a continuation of and claims priority to U.S. Non-Provisional patent application Ser. No. 13/802,140, filed Mar. 13, 2013, the contents of which are incorporated by reference herein in their entirety.

FIELD OF THE DISCLOSURE

The present disclosure is generally related to non-volatile memory.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 3 bits per cell, 4 bits per cell, or more. Although increasing the number of bits per cell and reducing device feature dimensions may increase storage density of a memory device, a bit error rate of data stored at the memory device may also increase.

Error correction coding (ECC) is often used to correct errors that occur in data read from a memory device. Prior to storage, data may be encoded by an ECC encoder to generate redundant information (e.g. "parity bits") that may be stored with the data as an ECC codeword. As more parity bits are used, an error correction capacity of the ECC increases and a number of bits required to store the encoded data also increases.

Once memory cells in a data storage device have been programmed, data may be read from the memory cells by sensing the programmed state of each memory cell by comparing the cell threshold voltage to one or more reference voltages. However, the sensed programming states can sometimes vary from the written programmed states due to one or more factors, such as read disturb conditions that may be caused by read access to nearby memory cells, such as memory cells at adjacent word lines of the memory device.

SUMMARY

Remedial action for read disturb effects may be performed based on a probability threshold when data is read from a target word line of a memory. When a randomly generated value satisfies the probability threshold, remedial action, such as a word line reassignment, may be performed to a word line that neighbors the target word line. Reassigning word lines based on the probabilistic threshold provides a low-complexity mechanism to significantly reduce a likelihood of unrecoverable data due to accumulated read disturb effects in a neighbor of a frequently-accessed word line.

DETAILED DESCRIPTION

Figure 1:
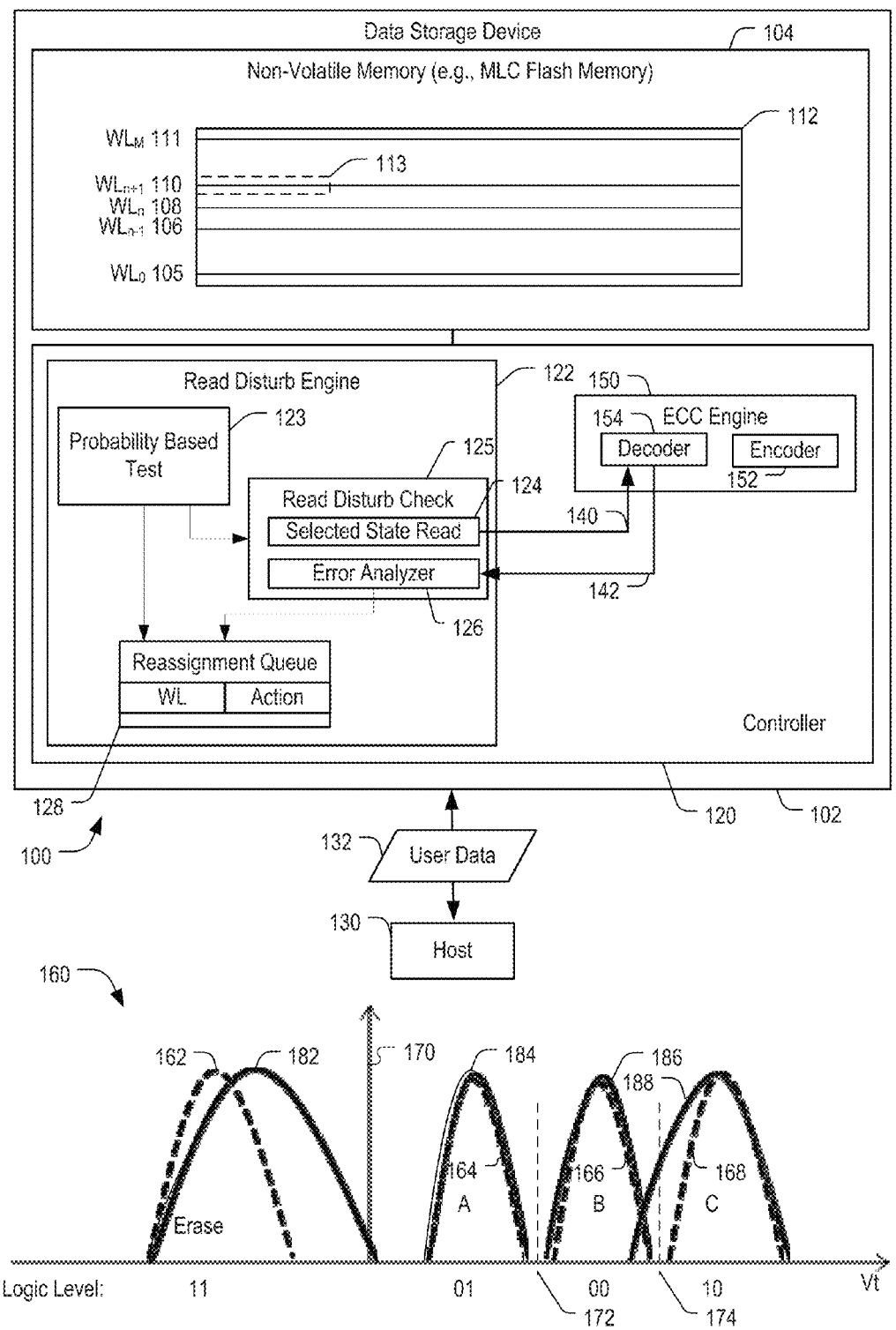
FIG. 1 is a block diagram of a particular illustrative embodiment of a system including a data storage device including a read disturb engine configured to determine based on a probability threshold whether to perform a remedial action for read disturb effects and illustrates an example of disturb effects that may occur to states of storage elements.

Referring to FIG. 1, a particular embodiment of a system 100 includes a data storage device 102 coupled to a host device 130. The data storage device 102 is configured to determine, based on a probability threshold, whether to perform a remedial action to mitigate read disturb effects.

The host device 130 may be configured to provide data, such as user data 132, to be stored at the non-volatile memory 104 or to request data to be read from the non-volatile memory 104. For example, the host device 130 may include a mobile telephone, a music player, a video player, a gaming console, an electronic book reader, a personal digital assistant (PDA), a computer, such as a laptop computer or notebook computer, any other electronic device, or any combination thereof. The host device 130 communicates via a memory interface that enables reading from the non-volatile memory 104 and writing to the non-volatile memory 104. For example, the host device 130 may operate in compliance with a Joint Electron Devices Engineering Council (JEDEC) industry specification, such as a Universal Flash Storage (UFS) Host Controller Interface specification. As other examples, the host device 130 may operate in compliance with one or more other specifications, such as a Secure Digital (SD) Host Controller specification as an illustrative example. The host device 130 may communicate with the non-volatile memory 104 in accordance with any other suitable communication protocol.

The data storage device 102 includes the non-volatile memory 104 coupled to a controller 120. The non-volatile memory 104 may be a flash memory, such as a NAND flash memory. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 130 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The non-volatile memory 104 includes multiple storage elements, such as MLC flash cells. The non-volatile memory 104 may include multiple blocks, such as a representative block 112 that includes a first edge word line WL0 105, a second edge word line WLM 111, a first word line WLn 108, a first neighbor word line WL(n−1) 106, and a second neighbor word line WL(n+1) 110. The edge word lines 105, 111 correspond to word lines closes to an edge of the block 112. The neighbor word lines 106, 110 are word lines that are adjacent to the first word line 108.

The controller 120 is configured to receive data and instructions from and to send data to the host device 130 while the data storage device 102 is operatively coupled to the host device 130. The controller 120 is further configured to send data and commands to the non-volatile memory 104 and to receive data from the non-volatile memory 104. For example, the controller 120 is configured to send data and a write command to instruct the non-volatile memory 104 to store the data to a specified address. As another example, the controller 120 is configured to send a read command to read data from a specified address of the non-volatile memory 104.

The controller 120 includes an ECC engine 150 that is configured to receive data to be stored to the non-volatile memory 104 and to generate a codeword. For example, the ECC engine 150 may include an encoder 152 configured to encode data using an ECC encoding scheme, such as a Reed Solomon encoder, a Bose-Chaudhuri-Hocquenghem (BCH) encoder, a low-density parity check (LDPC) encoder, a Turbo Code encoder, an encoder configured to encode data according to one or more other ECC encoding schemes, or any combination thereof. The ECC engine 150 may include a decoder 154 configured to decode data read from the non-volatile memory 104 to detect and correct, up to an error correction capability of the ECC scheme, bit errors that may be present in the data.

The controller 120 includes a read disturb engine 122. The read disturb engine 122 is configured to determine, based on a probability threshold, whether to perform a remedial action to a selected word line. For example, in response to a request to read data from a target word line (e.g., the first word line 108), the read disturb engine 122 may perform a probability based test 123 to determine whether to initiate a remedial action with respect to a second word line (e.g., the first neighbor word line 110, the second neighbor word line 106, the first edge word line 105, or the second edge word line 111 of the block 112).

For example, the read disturb engine 122 may be configured to generate a random value (e.g., a random, semi-random, or pseudo-random number) at a random number generator in the controller 120. The read disturb engine 122 may include a comparator configured to compare the value to the read disturb threshold. In response to the value satisfying the read disturb threshold, the read disturb engine 122 may be configured to schedule the second word line for remedial action. To illustrate, the read disturb engine 122 may determine a value K as the read disturb threshold for the block 112, generate a random (or pseudo-random) value in the range from 1 to K, and compare the generated value to "1." In response to the generated value matching a "1" value (i.e., the read disturb threshold is satisfied), the second word line may be scheduled for remedial action. In response to the generated value being greater than "1" (i.e., the read disturb threshold is not satisfied), the second word line may not be scheduled for remedial action.

The read disturb engine 122 may be configured to determine the read disturb threshold based on a "hot count" (e.g., a count of write/erase (W/E) cycles) to the block that includes the target word line (i.e., the word line corresponding to the request). The read disturb threshold may be inversely proportional to the hot count. To illustrate, when the block 112 has a hot count of 1,000, the read disturb threshold may be determined to have a value of 10,000, and, when the block 112 has a hot count of 3,000, the read disturb threshold may be determined to have a value of 2,000.

The probability based test 123 may be performed according to other implementations that provide a probabilistic outcome based on a read disturb threshold. To illustrate, in an alternate implementation, the random value may be generated according to a fixed range (e.g., 1-10,000) and the read disturb threshold may vary to correspond to a portion of the fixed range. Using the example above, a hot count of 1,000 may correspond to a read disturb threshold of 1 (i.e., 1/10,000 of the range from 1-10,000) and a hot count of 3,000 may correspond to a read disturb threshold of 5 (i.e., 1/2,000 of the range from 1-10,000).

In a particular embodiment, the read disturb engine 122 is configured to schedule the second word line for remedial action by adding an indication (e.g., a word line index or address) of the second word line to a reassignment queue 128 upon determining that the read disturb threshold is satisfied. In another particular embodiment, the read disturb engine 122 is configured to perform a read disturb check 125 after determining that the read disturb threshold is satisfied to determine whether the second word line exhibits read disturb effects.

To implement the read disturb check 125, the read disturb engine 122 may be configured to initiate a selected state read operation 124 to read one or more selected states of storage elements in the non-volatile memory 104. For example, when data is requested from the first word line 108 and the read disturb engine 122 determines that the read disturb threshold is satisfied via the probability based test 123, the read disturb check 125 may be performed to read selected states of storage elements of the first neighbor word line 110. Data read from the selected states of the storage elements may be provided as selected state data 140 to the decoder 154 of the ECC engine 150. The selected state data 140 may include one or more representations of ECC codewords that may have one or more bit errors caused by read disturb effects to data while stored in the first neighbor word line 110. The selected state read 124 may include reading a portion, rather than all, of the first neighbor word line 110. To illustrate, the first neighbor word line 110 may include multiple (e.g., four) physical pages, and each physical page may include multiple logical pages. The selected state read 124 may read data corresponding to a single logical page 113 of the first neighbor word line 110.

The read disturb engine 122 may include an error analyzer 126 that is configured to receive an error count 142 from the decoder 154. For example, the error count 142 may include a count of errors that were detected and corrected in the selected state data 140. The error analyzer 126 may be configured to receive the error count 142 and to determine whether the group of storage elements under inspection is at risk of disturbances to stored data causing the stored data to be non-recoverable by the ECC engine 150. For example, the error analyzer 126 may compare the error count 142 to a threshold based on ECC correction capability, and in response to the error count 142 satisfying the threshold, the error analyzer 126 may cause a remedial action to be performed, such as by sending an indication of the word line under inspection to the reassignment queue 128.

The reassignment queue 128 may maintain a listing of word lines scheduled to have remedial action performed and may include an indication of one or more actions to be performed. For example, the reassignment queue 128 may schedule a particular word lines for a data move operation. After a remedial action has been performed to a word line that is listed in the reassignment queue 128, such as by operation of the controller 120 during a background operation, an entry corresponding to the word line may be removed from the reassignment queue 128.

A cell voltage distribution (CVD) 160 illustrates a set of curves representing states of storage elements of a particular word line of the non-volatile memory 104, such as the first word line 108. Prior to disturb effects, the cell voltage distribution 160 may include a first curve 162 representing a distribution of threshold voltages of storage elements programmed to an erase (Er) state, a second curve 164 illustrating a distribution of threshold voltages of storage elements programmed to state A, a third curve 166 representing a distribution of threshold voltages of storage elements programmed to state B, and a fourth curve 168 illustrating a distribution of threshold voltages of storage elements programmed to state C.

Prior to disturb effects, data values stored in storage elements may be sensed by applying one or more read voltages, such as a first read voltage 170 between the erase state and state A, a second read voltage 172 between state A and state B, and a third read voltage 174 between state B and state C. For example, by applying the first read voltage 170 to each of the storage elements of a single word line, all storage elements of the word line having a threshold voltage less than the first read voltage 170 (i.e., all storage elements in the erase state), may be determined. As illustrated, each of the states may have a 2-bit value associated with the state. Storage elements in the erase state may correspond to a data value of 1 1, storage elements in state A may correspond to a data value of 0 1, storage elements in state B may correspond to a data value of 0 0, and storage elements in state C may correspond to a data value of 1 0.

After occurrence of one or more disturb effects, such as a read disturb, the curves 162-168 may shift, resulting in a first shifted curve 182 corresponding to storage elements originally in the erase state, a second shifted curve 184 corresponding to storage elements originally programmed to state A, a third shifted curve 186 corresponding to storage elements originally programmed to state B, and a fourth shifted curve 188 corresponding to storage elements originally programmed to state C.

As illustrated, the first shifted curve 182 has broadened as compared to the first curve 162. The first shifted curve 182 has a portion to the right of the first read voltage 170, representing storage elements having threshold voltages that have increased to have a threshold voltage value that is greater than the first read voltage 170. When storage elements are read using the first read voltage 170, storage elements of the first shifted curve 182 having threshold voltages to the right of the first read voltage 170 are incorrectly read as being in state A rather than in the erase state. As a result, the most significant bit (e.g., the upper bit) of data read from such storage elements may be incorrectly read as a 0 value instead of a 1 value.

Similarly, the fourth shifted curve 188 illustrates that storage elements originally programmed to state C may have threshold voltages that have lowered to a threshold voltage value that is less than the third read voltage 174. As a result, such storage elements are incorrectly identified as being in state B when read using the third read voltage 174. Data read from such storage elements may be incorrectly read as having a most significant bit value of 0 instead of the originally programmed bit value of 1.

As illustrated in the CVD 160, disturb effects may be more pronounced in states having a lowest voltage range (e.g., the erase state in the example illustrated in FIG. 1) and in states having a highest voltage range (e.g., state C in the example illustrated in FIG. 1). To efficiently determine whether or not storage elements of a particular word line are at risk due to read disturb effects, the selected state read operation 124 performed by the read disturb engine 122 may be performed to read states most likely to be affected by read disturbs, such as the erase state. As a result, when a word line under inspection is read according to the selected state read operation 124, the upper page (e.g., only the most significant bit of each state) may be read by applying the first read voltage 170 and the third read voltage 174 to read the erase state and state C of the storage elements of the word line, without using the second read voltage 172 to read state A and state B of the storage elements of the word line (i.e., the selected state read operation 124 may read the erase state and state C and may exclude state A and state B). As a result, reads of states for purposes of determining reliability of data may be performed with a reduced number of read operations as compared to reading all four states of each storage element of the word line under inspection.

During operation, the host device 130 may send a request to read the user data 132 from the non-volatile memory 104. In response, the controller 120 may send a read command to read the requested data from the first word line 108.

The read command to access the first word line 108 may trigger the read disturb engine 122 to select one or more neighboring word lines for potential remedial action. For example, when the host device 130 requests to read data from the first word line 108, the read disturb engine 122 may initiate the probability based test 123 to determine whether to perform remedial action to one or more other word lines in the block 112.

For example, in some implementations, one or more word lines of the block 112 may store data that is read relatively frequently but that is refreshed relatively infrequently, such as boot code or configuration data for an application that is executed at the host device 130. Repeated reads of a small number of word lines in a block, without refreshing, causes read disturb effects to accumulate in neighboring word lines. The accumulated read disturb effects may result in an amount of data corruption that exceeds a correction capability of the decoder 154 in a statistically predictable number of read operations. For example, when a block has a hot count of 1,000, approximately 10,000 reads of one word line may cause uncorrectable errors in a neighboring word line. By setting the read disturb threshold K equal to 10,000 when the hot count is 1,000, the probability that any word line in the block becomes unreadable due to read disturb effects is reduced.

In response to the probability based test 123, one or more neighboring word lines may be selected for reassignment, and the reassignment queue 128 may be updated. Alternatively or in addition, one or more of the word lines at the edges at the block, such as one or more of the edge word lines 105 and 111, may be added to the reassignment queue 128. The word lines at the edges of the block may be more susceptible to disturb effects due to processing differences (e.g., due to being adjacent to a "dummy" word line during fabrication). One or both of the block edge word lines 105 and 111 may be added to the reassignment queue 128 independent of whether the requested word line is adjacent to the block edge word line.

Alternatively, in response to the probability based test 123, one or more neighboring word lines may be selected for the read disturb check 125 to determine whether remedial action is to be performed. Because the selected state read operation 124 may be performed more quickly than a full word line data read operation, inspection of one or more neighboring word lines of a target word line of a host read request may be performed efficiently and with relative small additional latency as compared to reading requested data from the target word line.

Since the read disturb engine 122 may cause remedial action to be performed based on a probability threshold corresponding to read disturb effect, a reliability of stored data may be improved due to fewer bit errors accumulating in word lines that neighbor frequently-accessed word lines in the non-volatile memory 104. Improved reliability may enable operation using a less-powerful ECC engine 150, resulting in reduced power consumption, reduced device size, reduced manufacturing cost, or a combination thereof. Alternatively, or in addition, improved reliability may enable longer operational life of the non-volatile memory 104.

Figure 2:
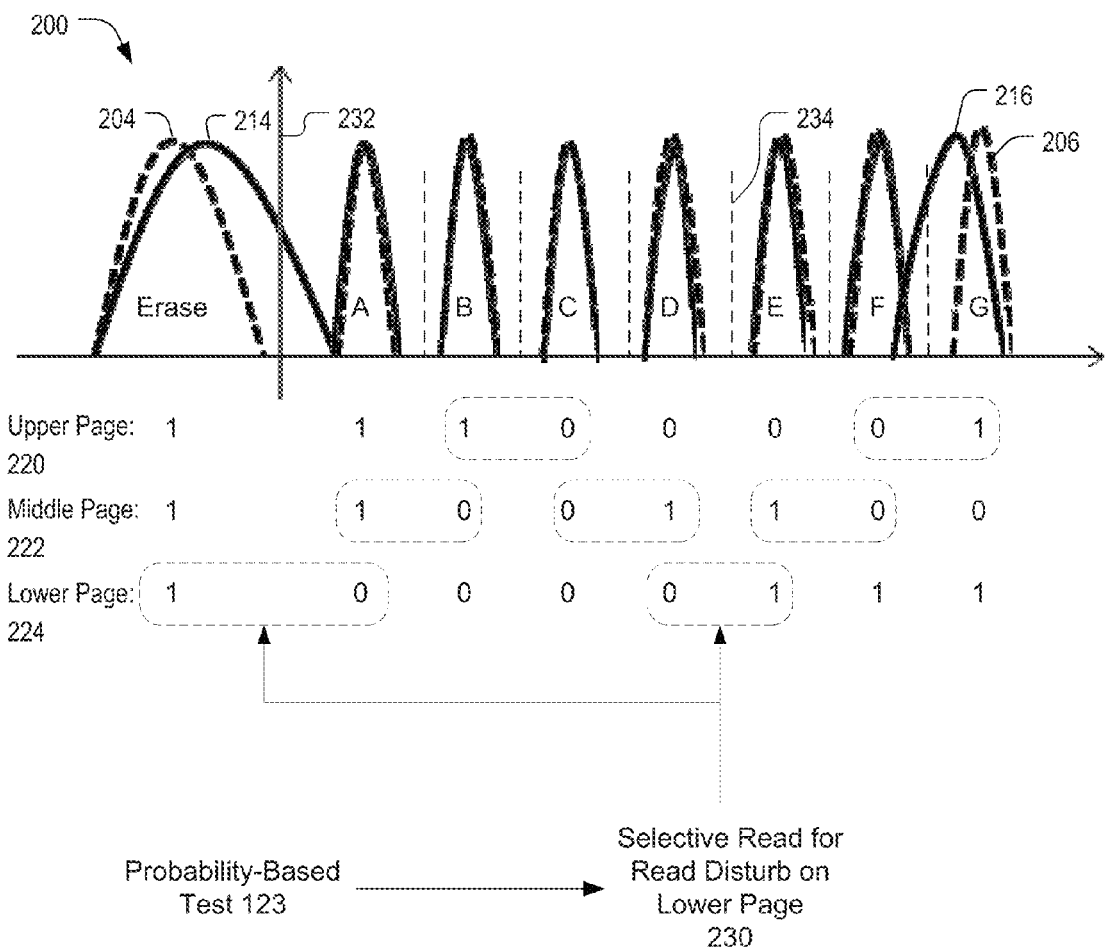
FIG. 2 is a general diagram illustrating a selective read operation that may be performed by the data storage device of FIG. 1.

Referring to FIG. 2, a charge voltage distribution (CVD) 200 is illustrated for a 3-bit per cell (BPC) implementation of the non-volatile memory 104 of FIG. 1. The CVD 200 illustrates eight states, including an erase (Er) state and states A-G. A first curve 204 illustrates a distribution of threshold voltages of storage elements originally in the erase state, and a second curve 214 illustrates a distribution of the threshold voltages of the storage elements of the first curve 204 after occurrence of disturb effects. A third curve 206 illustrates a distribution of threshold voltages of storage elements originally programmed to state G (i.e., a highest voltage state in the example illustrated in FIG. 2), and a fourth curve 216 illustrates a distribution of threshold voltages of the storage elements of the third curve 206 after the occurrence of disturb effects.

A mapping of bits to states is also illustrated, showing that the erase state has a 3-bit value of 1 1 1, corresponding to a bit value of 1 in an upper page 220, a bit value of 1 in a middle page 222, and a bit value of 1 in a lower page 224. Similarly, storage elements programmed to state A correspond to a 3-bit value of 1 1 0, having a bit value of 1 in the upper page 220, a bit value of 1 in the middle page 222, and a bit value of 0 in the lower page 224. The upper page 220 may store a first ECC codeword, the middle page 222 may store a second ECC codeword, and the lower page 224 may store a third ECC codeword. By storing independently decodable ECC codewords in each of the logical pages 220-224, a single decodable codeword may retrieved from a physical page at the MLC word line by reading a single page 220, 222, or 224, without reading data corresponding to all three pages 220-224.

For example, based on the outcome of the probability based test 123 of FIG. 1, the lower page 224 may be read by performing a first sensing operation using a first read voltage 232, corresponding to a boundary between the erase state and state A, and performing a second sense operation using a second read voltage 234, corresponding to a boundary between state D and state E. Storage elements that are activated when sensed using the first read voltage 232 are read as storing a 1-bit in the lower page 224, and storage elements that are activated when sensed using the second read voltage 234 but not activated when sensed using the first read voltage 232 are read as storing a 0 value in the lower page 224. Storage elements that are not activated when sensed using the second read voltage 234 are read as storing a 1 value in the lower page 224. Thus, the lower page 224 may be read by sensing storage elements using only two read voltages 232, 234.

Because read disturb effects may be predicted to occur in the lowest voltage state (e.g., the erase state), the read disturb engine 122 may perform the selected state read operation 124 to identify data stored in only the lowest state for efficiency when determining a risk of data loss due to read disturb effects in a word line. For example, to detect read disturb effects that typically increase a threshold voltage of cells stored to the erase state, the selected state read operation 124 may correspond to a selective state read for read disturb effects 230 to read data stored in the lower page 224. That is, the selected state read operation 124 may include a sensing of cells using the first read voltage 232 and the second read voltage 234. Data read from the lower page 224 may be a representation of an ECC codeword that may include one or more data errors. The representation of the ECC codeword may be provided as the selected state data 140 to the ECC engine 150. The ECC decoder 154 may perform an ECC decode operation on the representation of the ECC codeword read from the lower page 224 and may determine a count of errors occurring in the data.

Because errors occurring in the erase state due to a transition between the erase state and state A (Er-A) are more likely than data errors occurring due to a transition between state D and state E (D-E), an error count associated with decoding the ECC codeword of the lower page 224 may be assumed to be due to read disturb effects to the erase state when analyzed by the error analyzer 126 of FIG. 1 for determination of whether remedial action is to be taken. However, in other implementations Er-A errors occurring due to voltage shifting across the first read voltage 232 may be distinguished from D-E errors occurring due to voltage shifting across the second read voltage 234 by reading additional data from the word line. For example, in a technique known as "error splitting", data corresponding to the upper page 220 may be read to determine whether a particular storage element experiencing a bit error in the lower page 224 is programmed to the erase state or state A, or is programmed to state D or state E. For example, when a storage element is programmed to the erase state or state A, the upper page 220 has a 1 value, while if the storage element is programmed to state D or state E, the upper page 220 has a 0 value.

Figure 3:
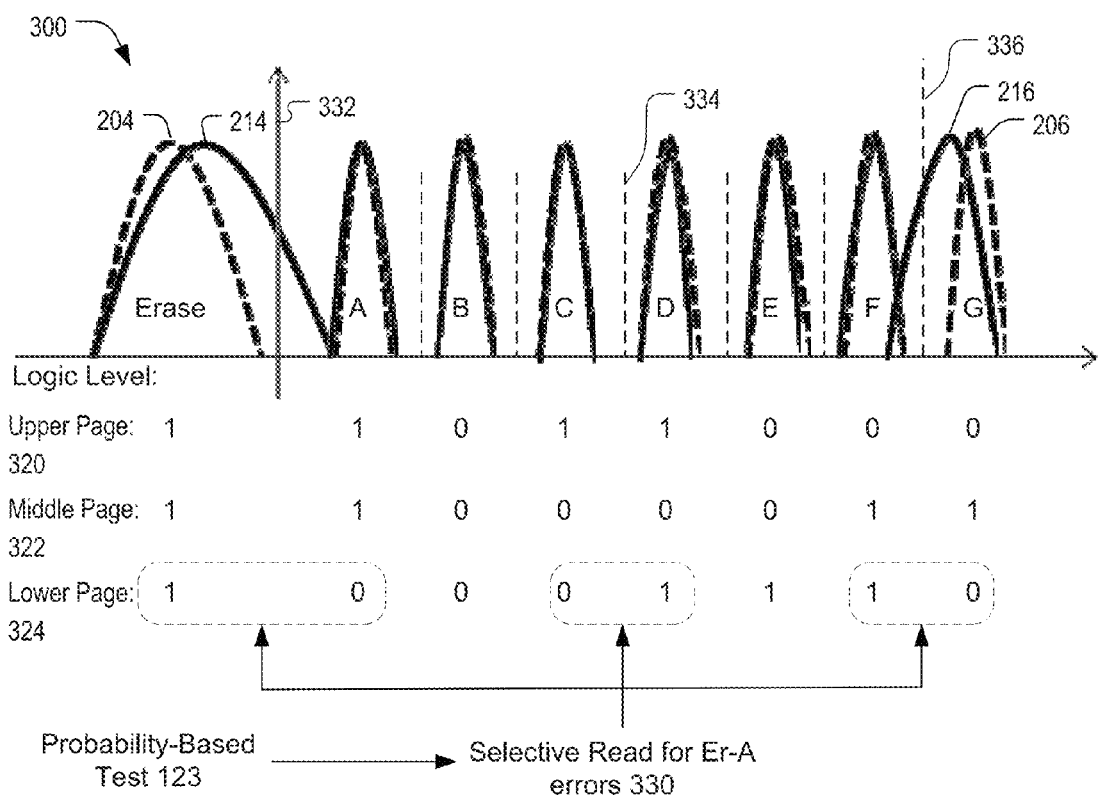
FIG. 3 is a general diagram illustrating another selective read operation that may be performed by the data storage device of FIG. 1.

FIG. 3 illustrates a CVD 300 corresponding to the CVD 200 of FIG. 2, having the first curve 204 and the second curve 214 corresponding to a threshold voltage distribution of storage elements in the erase state prior to and after disturb effects respectively, and having the third curve 206 and the fourth curve 216 corresponding to threshold voltage distributions of storage elements originally programmed to state G prior to and after disturb effects, respectively. FIG. 3 illustrates a different mapping of bits to states than FIG. 2 that may enable even more efficient disturb detection. An upper page 320 can be read using read voltages at the A-B, B-C, and D-E state boundaries. A middle page 322 can be read using read voltages at the A-B and E-F state boundaries. A lower page 324 can be read using a first read voltage 332 at the Er-A state boundary, a second read voltage 334 at the C-D state boundary, and a third read voltage 336 at the F-G state boundary.

Because data errors due to threshold voltage shifting across the Er-A boundary occurs in the lower page 324, the selected state read operation 124 of FIG. 1 may include a selective read for Er-A errors 330 that reads the lower page 324 based on the outcome of the probability based test 123 of FIG. 1. The selective read for Er-A errors 330 can include performing a first sense operation using the first read voltage 332, a second sense operation using the second read voltage 334, and a third sense operation using the third read voltage 336.

The data from the lower page 324 may be provided to the ECC engine 150 to determine a total number of errors and bit locations of the errors that are corrected by the ECC decoder 154. The total number of errors may be analyzed by the error analyzer 126 to determine a remedial action, such as a reassignment operation. In another implementation, the error count 142 may be apportioned between errors due to disturbs of storage elements from the erase state to state A and errors due to disturbs of storage elements from state G to state F, resulting in a more accurate determination of a cause of disturb errors and an appropriate remedial action to be taken by the read disturb engine 122.

Figure 4:
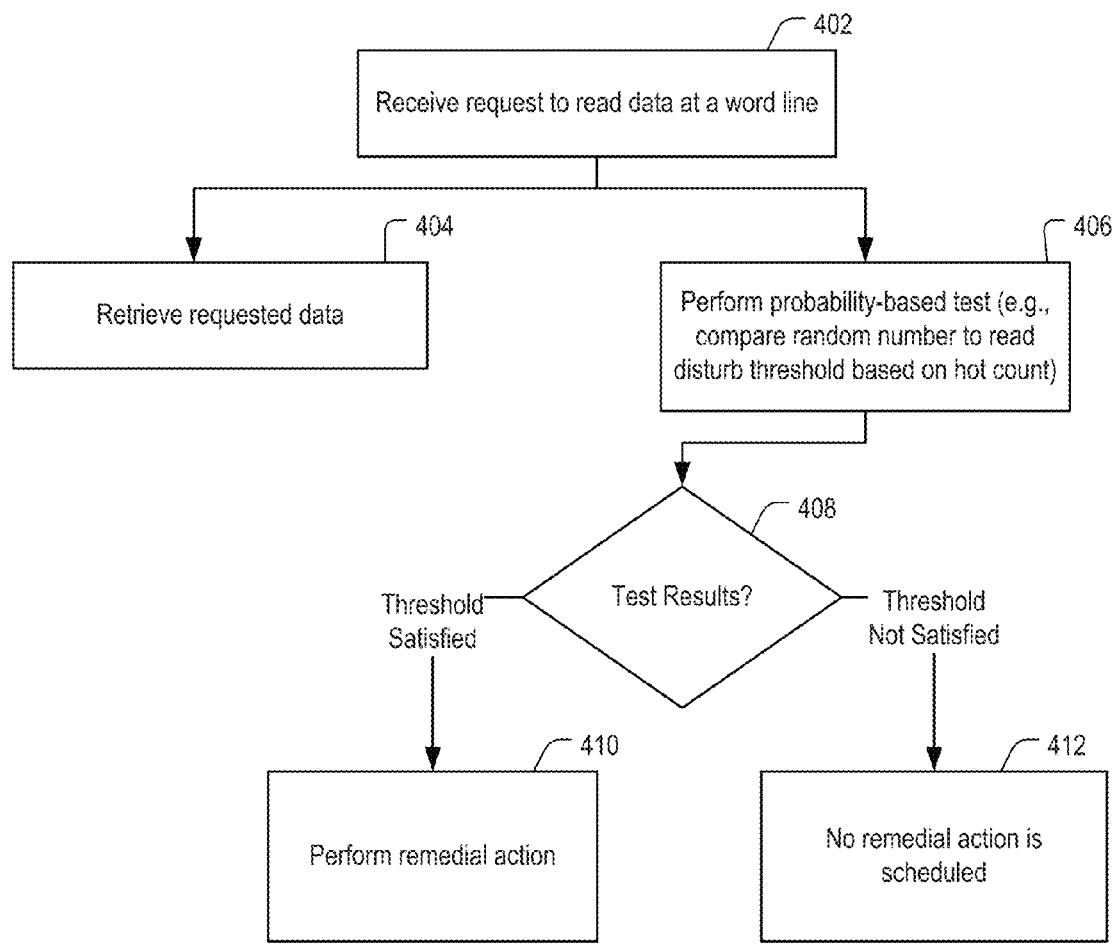
FIG. 4 is a flow chart of a particular embodiment of a method of determining based on a probability threshold whether to perform a remedial action for disturb effects.

Referring to FIG. 4, a particular embodiment of a method 400 is depicted. The method 400 may be performed in a data storage device that includes a memory and a controller, such as the data storage device 102 of FIG. 1.

The method 400 includes receiving a request to read data from the memory, at 402. The data is located within a first word line of the memory. For example, the data may be located in the first word line 108 of FIG. 1.

In response to the request to read data from the memory, the data is read from the first word line, at 404. For example, the request may be received from a host device, such as the host device 130 of FIG. 1, while the data storage device is operatively coupled to the host device. Alternatively, the request may be generated at the controller 120, such as by a memory management or other process executing at the controller 120. The data read from the first word line may be decoded to generate decoded data, such as at the decoder 154. The decoded data may be provided to the host device in response to the request to read the data.

Also in response to the request, a determination is made, based on a probability threshold, whether to perform a remedial action with respect to a second word line. For example, determining whether to perform the remedial action may include performing a probability-based test, at 406. For example, the read disturb engine 122 may perform the probability based test 123 by generating a value and comparing the value to the probability threshold. The value may be generated randomly, semi-randomly, or pseudo-randomly.

For example, the probability threshold may be selected based on a read disturb threshold associated with the second word line. The read disturb threshold may be based on a hot count (e.g., a count of write/erase cycles). The read disturb threshold may be inversely proportional to the count of write/erase cycles.

Determining whether to perform the remedial action may also include determining a number of errors in second data in at least a portion of the second word line. For example, after determining that the generated value satisfies the probability threshold, a first logical page of the next word line may be read (based on the Er-A read threshold voltage) and processed by the ECC engine 150 to determine a number of errors in the first logical page. A determination of whether to perform the remedial action may be further based on the number of errors in the second data. To illustrate, when the error analyzer 126 determines that the number of errors exceeds an error threshold, the second word line may be selected for remedial action.

A result of the probability-based test may be determined, at 408, and the remedial action is performed if the value satisfies the probability threshold (e.g., a "match"), at 410. Performing the remedial action may include reassigning second data stored in the second word line to a different word line of the memory. For example, an entry corresponding to the second word line may be added into a reassignment queue, such as the reassignment queue 128 of FIG. 1, prior to reassigning the second data. The remedial action may also include reassigning third data stored in a third word line to a second different word line of the memory. For example, the second word line may be a neighbor of the first word line, and the third word line may be an edge word line (e.g., the edge word line 105 or 111) of a memory block that includes the first word line and the second word line.

Although various components depicted herein are illustrated as block components and described in general terms, such components may include one or more microprocessors, state machines, or other circuits configured to enable the read disturb engine 122 of FIG. 1 to initiate the probability based test 123 and selectively schedule a remedial action to be performed based on the outcome of the probability based test 123. For example, the read disturb engine 122 may represent physical components, such as hardware controllers, state machines, logic circuits, or other structures, to enable the read disturb engine 122 of FIG. 1 to initiate the probability based test 123 and selectively schedule a remedial action to be performed based on the outcome of the probability based test 123.

The read disturb engine 122 may be implemented using a microprocessor or microcontroller programmed to initiate the probability based test 123 and to selectively schedule a remedial action to be performed based on the outcome of the probability based test 123. In a particular embodiment, the read disturb engine 122 includes a processor executing instructions that are stored at the non-volatile memory 104. Alternatively, or in addition, executable instructions that are executed by the processor may be stored at a separate memory location that is not part of the non-volatile memory 104, such as at a read-only memory (ROM).

In a particular embodiment, the data storage device 102 may be implemented in a portable device configured to be selectively coupled to one or more external devices. However, in other embodiments, the data storage device 102 may be attached or embedded within one or more host devices, such as within a housing of a host communication device. For example, the data storage device 102 may be within a packaged apparatus such as a wireless telephone, a personal digital assistant (PDA), a gaming device or console, a portable navigation device, or other device that uses internal non-volatile memory. In a particular embodiment, the data storage device 102 may be coupled to a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device that includes a memory and a controller associated with operation of memory cells of the memory, the data storage device coupled to a three-dimensional memory, performing, in response to a request to read data from the memory, wherein the data is located within a first word line of the memory:
accessing the data from the first word line;
generating a value corresponding to a second word line of the memory;
performing a comparison between the value and a probability threshold; and
determining, based on the comparison, to perform a remedial action with respect to the second word line.

2. The method of claim 1, further comprising generating the probability threshold in response to the request, wherein the probability threshold is associated with the second word line, and wherein the probability threshold is generated based on a count of write/erase cycles of a memory block that includes the second word line.

3. The method of claim 1, wherein the value is generated randomly, semi-randomly, or pseudo-randomly.

4. The method of claim 1, wherein the remedial action is determined to be performed if the value satisfies the probability threshold.

5. The method of claim 1, further comprising selecting the probability threshold based on a read disturb threshold associated with the second word line.

6. The method of claim 5, wherein the read disturb threshold is based on a count of write/erase cycles.

7. The method of claim 6, wherein the read disturb threshold is inversely proportional to the count of write/erase cycles.

8. The method of claim 1, further comprising performing the remedial action, wherein performing the remedial action includes reassigning second data stored in the second word line to a different word line of the memory.

9. The method of claim 8, wherein performing the remedial action further includes reassigning third data stored in a third word line to a second different word line of the memory.

10. The method of claim 9, wherein the second word line is a neighbor of the first word line and the third word line is an edge word line of a memory block that includes the first word line and the second word line.

11. The method of claim 1, further comprising:
determining a number of errors in second data in at least a portion of the second word line; and
determining whether to perform the remedial action based on the number of errors in the second data.

12. The method of claim 1, wherein the second word line is a neighbor of the first word line, and wherein the memory is distinct from the 3D memory.

13. The method of claim 1, wherein the request is received from a host device while the data storage device is operatively coupled to the host device, and further comprising retrieving the data from the first word line, decoding the data to generate decoded data, and providing the decoded data to the host device in response to the request to read the data.

14. The method of claim 1, further comprising:
adding an entry corresponding to the second word line into a reassignment queue;
after the entry is added to the reassignment queue, performing a background operation, wherein the remedial action is performed during the background operation; and
removing the entry from the reassignment queue after the remedial action is performed.

15. A data storage device comprising:
a memory including a first word line and a second word line; and
a controller coupled to a three-dimensional (3D) memory, wherein the controller is associated with operation of memory cells of the memory and is configured, in response to a request to read data from the memory, wherein the data is located within a first word line of the memory, to access the data from the first word line and to generate a value corresponding to the second word line and to perform a comparison between the value and a probability threshold, and wherein the controller is further configured to determine, based on the comparison, to perform a remedial action with respect to the second word line.

16. The data storage device of claim 15, wherein the value is selected from a range of values, wherein the probability threshold corresponds to a portion of the range of values, wherein the memory is a non-volatile memory, and wherein the memory is distinct from the 3D memory.

17. The data storage device of claim 15, wherein the controller is configured to generate the value randomly, semi-randomly, or pseudo-randomly.

18. The data storage device of claim 15, wherein the controller is configured to perform the remedial action if the value satisfies the probability threshold.

19. The data storage device of claim 15, wherein the controller is configured to select the probability threshold based on a read disturb threshold associated with the second word line.

20. The data storage device of claim 19, wherein the read disturb threshold is based on a count of write/erase cycles.

21. The data storage device of claim 20, wherein the read disturb threshold is inversely proportional to the count of write/erase cycles.

22. The data storage device of claim 15, wherein the remedial action includes reassigning second data stored in the second word line to a different word line of the memory.

23. The data storage device of claim 22, wherein the remedial action further includes reassigning third data stored in a third word line to a second different word line of the memory.

24. The data storage device of claim 23, wherein the second word line is a neighbor of the first word line and the third word line is an edge word line of a memory block that includes the first word line and the second word line.

25. The data storage device of claim 15, wherein the controller is configured to determine a number of errors in second data in at least a portion of the second word line and to determine whether to perform the remedial based on the number of errors in the second data.

26. The data storage device of claim 15, wherein the second word line is a neighbor of the first word line.

27. The data storage device of claim 15, wherein the controller is configured to retrieve the data from the first word line, to decode the data to generate decoded data, and to provide the decoded data to a host device in response to the request to read the data.

28. The data storage device of claim 15, wherein the controller is configured to perform the remedial action by adding an entry corresponding to the second word line into a reassignment queue.

* * * * *